United States Patent
Ait-Mani

(10) Patent No.: US 8,404,075 B2
(45) Date of Patent: Mar. 26, 2013

(54) METHOD FOR THICKNESS-CALIBRATED BONDING BETWEEN AT LEAST TWO SUBSTRATES

(75) Inventor: Abdenacer Ait-Mani, Saint-Egreve (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 13/163,350

(22) Filed: Jun. 17, 2011

(65) Prior Publication Data

US 2011/0308724 A1    Dec. 22, 2011

(30) Foreign Application Priority Data

Jun. 18, 2010 (FR) ...................... 10 02584

(51) Int. Cl.
- B29C 65/00 (2006.01)
- B32B 37/00 (2006.01)
- B29C 65/48 (2006.01)
- A63B 39/00 (2006.01)
- A63B 41/00 (2006.01)

(52) U.S. Cl. ............................ 156/295; 156/87; 156/145

(58) Field of Classification Search ............... 156/87, 156/145, 295

See application file for complete search history.

(56) References Cited

U.S. PATENT DOCUMENTS

| | | | | |
|---|---|---|---|---|
| 5,292,686 | A | * | 3/1994 | Riley et al. ............... 438/605 |
| 2002/0193035 | A1 | * | 12/2002 | Wei et al. ............... 445/22 |
| 2004/0009649 | A1 | | 1/2004 | Kub et al. |
| 2006/0124230 | A1 | | 6/2006 | Chartier et al. |
| 2009/0075423 | A1 | | 3/2009 | Fendler et al. |

FOREIGN PATENT DOCUMENTS

| | | | |
|---|---|---|---|
| DE | 10 2006 053 916 B3 | | 6/2008 |
| FR | 2 798 935 A1 | | 3/2001 |
| FR | 2 856 047 A1 | | 12/2004 |
| FR | 2 921 201 A1 | | 3/2009 |
| JP | 2009081391 A | * | 4/2009 |
| JP | A-2009-081391 | | 4/2009 |

* cited by examiner

Primary Examiner — Christopher Schatz
Assistant Examiner — Matthew Hoover
(74) Attorney, Agent, or Firm — Oliff & Berridge, PLC

(57) ABSTRACT

A bonding method between at least two substrates comprises deposition of at least one drop of liquid adhesive on one of the two substrates and bringing the two substrates into contact causing spreading of the liquid adhesive followed by formation of a solidified adhesive layer between the two substrates. One of the two substrates is further provided, at the surface thereof, with at least one salient rim in which at least one slit is formed, designed to remove the excess liquid adhesive when the two substrates are brought into contact. Finally, the volume of liquid adhesive deposited on one of the two substrates is greater than the volume of the bonding space delineated by said rim between the contacted substrates, and the deposited drop of liquid adhesive presents a strictly greater height than the height of the rim. A defect-free solidified adhesive layer of calibrated thickness can thus be obtained.

11 Claims, 4 Drawing Sheets

METHOD FOR THICKNESS-CALIBRATED BONDING BETWEEN AT LEAST TWO SUBSTRATES

BACKGROUND OF THE INVENTION

The invention relates to a method for bonding between at least two substrates comprising:
- a step of deposition of at least one drop of liquid adhesive on one of the two substrates,
- and a step of bringing the two substrates into contact causing spreading of the liquid adhesive followed by formation of a layer of solidified adhesive between the two substrates.

STATE OF THE ART

As indicated in Patent application US-A-2004/0009649, several bonding techniques exist in the microelectronics field to assemble at least two substrates, such as wafers made from semiconductor materials, to one another. In particular, assembly can be performed by direct wafer bonding with thin bonding material layer, for example atom-to-atom bonding, or metal direct bonding. Another technique consists in performing bonding by means of a layer of adhesive arranged at the interface between the two substrates to be assembled. The adhesive layer is in general organic and more particularly made from polymer material (polymer wafer bonding), but it can also be inorganic in certain cases.

Bonding by means of an adhesive layer consists in particular in forming a polymer layer, for example made from PMMA, polyimide or BCB, at the interface between the two substrates to be assembled. Assembly of the two substrates is in most cases achieved by applying a pressure on one and/or the other of the substrates when the latter are brought into contact, and can be followed by an annealing step to increase the bonding resistance.

However, one of the major problems encountered in bonding methods using a layer of organic or inorganic adhesive is connected with the difficulty of mastering the quantity of adhesive deposited and therefore of controlling the final thickness of the adhesive layer over the whole interface. It is indeed frequent to deposit a larger quantity of adhesive than necessary to form an adhesive layer of predefined thickness. However, after assembly, the excess adhesive deposited does tend to be removed over the whole perimeter of the bonded area, which generates an inhomogeneity of thickness at the bonding interface between the centre and the periphery of the interface. Moreover, when a pressure is applied on one and/or on the other of the substrates, in particular in the case of parts of large surface, it may be difficult to distribute the necessary pressure uniformly over the whole of the surface to be bonded, which also gives rise to defective bondings.

For example purposes, Patent application FR-A-2798935 proposes a method for bonding two surfaces ensuring uniform bonding, without any risk of damaging the parts to be bonded by applying a pressure when the two surfaces are assembled. In particular, the method proposed in Patent application FR-A-2798935 consists in forming a cavity situated between the two surfaces to be bonded by means of a seam of adhesive, in making the cavity tight and in producing a positive pressure difference between the surrounding pressure prevailing in the area outside the cavity and the pressure prevailing in the cavity by means of an opening made in at least one of the surfaces. The parts to be bonded are thus contacted on one another by the effect of the pressure difference produced. This technique does however require the quantity of adhesive deposited in the form of a seam of adhesive and the arrangement of the seam of adhesive to be able to be perfectly well controlled in order to obtain uniform defect-free bonding.

Patent application FR-A-2921201 proposes a collective method for bonding individual chips onto a common substrate enabling a homogeneous and blister-free adhesive film to be obtained. In particular, the method proposed in Patent application FR-A-2921201 comprises the following steps:
- disposing functionalized or active layers on a support in non-contiguous adjacent manner, with a spacing between two adjacent layers,
- deposition of a calibrated drop of adhesive on each of the functionalized layers,
- placing a stress substrate on these drops of adhesive,
- and singularization of the parts of the assembly thus formed to achieve wafers bonded onto the stress substrate.

The disposition of the functionalized layers with respect to one another creates channels resembling tanks enabling bubbles to be locally trapped. However, as indicated in the foregoing, such a method does not enable the final thickness of the adhesive film after the annealing step to be controlled on a functionalized layer but also from one functionalized layer to the other.

DISCO ABRASIVE SYSTEMS LTD have furthermore developed a method called TAIKO method in which backgrinding is performed in a different manner from conventional backgrinding methods. In particular, when grinding of the rear surface of a semiconductor wafer is performed, this is done in such a way as to leave a non-grinded rim of about 2 mm on the rear surface of the wafer. The presence of such a rim is designed to reduce the risks related to handling thin wafers and the risks of deformation of the flat surface of the wafers also known as warpage. Once backgrinding has been performed and as indicated in Japanese Patent application JP2009081391, a binder is disposed in the area delineated by the non-grinded rim, the surface of the rear face comprising the rim and the adhesive material is planarized before being placed on an element, called dicing strip, secured in an annular metal peripheral frame, in order to dice the wafer into a plurality of chips.

OBJECT OF THE INVENTION

The object of the invention is to propose a method for bonding between at least two substrates, and more particularly between at least two substrates made from semiconductor materials, remedying the shortcomings of the prior art. In particular, the object of the invention is to propose a method for bonding between at least two substrates comprising:
- a deposition step of at least one drop of liquid adhesive on one of the two substrates,
- and a step of bringing the two substrates into contact causing spreading of the liquid adhesive followed by formation of a solidified adhesive layer between the two substrates, said solidified adhesive layer obtained being defect-free and of uniform and controlled thickness.

is According to the invention, this object is achieved by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which:

FIGS. 1 and 2 represent the different steps of a particular embodiment of a method for bonding between two substrates, schematically and in cross-section, whereas

FIGS. 4 to 13 represent different steps for performing bonding of a bulk substrate to a plurality of thinned coplanar substrates, schematically and in cross-section, whereas

FIGS. 15 to 18 represent different steps for performing bonding of a substrate to a plurality of thinned coplanar substrates, schematically and in cross-section, whereas

DESCRIPTION OF PARTICULAR EMBODIMENTS

Figure 1:
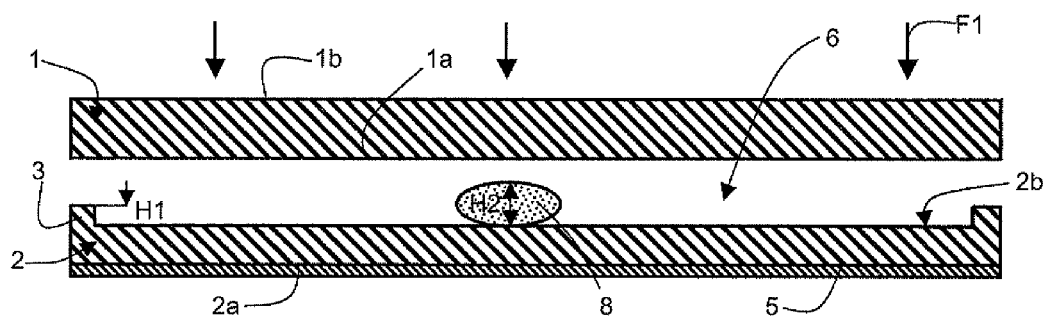

It is proposed to control the thickness of the solidified adhesive layer formed between at least two substrates to bond the latter to one another by providing one of the two substrates with a rim salient from the surface and in which at least one slit, also called vent, is formed. Such a rim delineates the bonding space, i.e. the space in which a solidified adhesive layer is formed and disposed once the substrates have been brought into contact.

The rim is advantageously formed on the surface of one of the substrates by a rib forming a closed periphery, except for the slit or slits arranged in said rim. It thus delineates, in the surface of said substrate, a housing (or cavity) designed to form the bonding space when the substrates are brought into contact. The rim further presents a particular height chosen according to the required thickness for the solidified adhesive layer arranged in said bonding space. This height is advantageously constant.

The volume of adhesive liquid deposited on one of the two substrates is furthermore greater than the volume of the bonding space. The excess liquid adhesive can thus be removed via the slit formed in the rim, when the substrates are brought into contact, instead of overflowing from said rim. The drop of liquid adhesive deposited on one or the other of the substrates further presents a height strictly larger than the height of the rim. Thus, when the substrates are brought into contact, the drop of adhesive deposited on one of the two substrates is the first element to come into contact with the other substrate, before the rim. Furthermore, due to the capillarity phenomenon, the liquid adhesive presents a good wettability in the bonding space and in particular in proximity to the rim delineating said bonding space. Spreading of the liquid adhesive in the bonding space then takes place automatically when the drop of adhesive comes into contact with the other substrate. The height of the drop of adhesive is advantageously ten times greater than the height of the rim. Moreover, the dimensions of the slit made in the rim are advantageously chosen according to the type of adhesive used and in particular according to the viscosity of the adhesive. The higher the viscosity of the adhesive, the larger the dimensions of the slit. For an adhesive of epoxy type, the slit advantageously presents a width larger than or equal to 10 µm and a height larger than or equal to 2 µm, which enables a slit having a surface of 20 µm$^2$ to be obtained for an adhesive presenting a viscosity of about 200 to 300 cPo.

A solidified adhesive layer of uniform thickness can then be obtained over the is whole bonding interface without any defects. The solidified adhesive layer advantageously presents a thickness of a few micrometers, typically between 1 µm and 3 µm, over almost the whole of the interface between the two substrates, which can vary from a few square millimeters to a few square centimeters.

Furthermore, the rim being salient from the surface of at least one substrate enables said substrate to be rigidified. This is in particular useful when the rear surface of the substrate is provided with a soft securing film, in order to limit the influence of the latter, and more particularly the influence of the undulation which this soft securing film may generate. In this case, the uniformity of the thickness of the adhesive layer depends solely on the surface state (flatness state) of the substrate which will be placed on the substrate provided with the rim. Indeed, if the substrate provided with a securing film does not comprise a rim, undulation of the securing film gives rise to undulation of the substrate which itself will give rise to undulation of the adhesive layer. In this case, a uniform adhesive film cannot be obtained, even with a perfectly flat added-on substrate.

Such a bonding method can be applied to different types of substrates, more particularly to substrates whose base is formed by semiconductor materials used in the microelectronics field, for example circular wafers. Each substrate is then mainly formed by a semiconductor material, such as silicon. These substrates can moreover be bulk substrates with a thickness for example comprised between 500 µm and 1000 µm or they can be thinned by any type of technique known in the microelectronics field with a final thickness for example comprised between 15 µm and 35 µm. Furthermore, one and/or the other of the substrates can be passive, i.e. without components, and/or active, i.e. with a microelectronic circuit such as a CMOS circuit. Finally, the substrates can in conventional manner each be placed on a protective layer, for example made from pyrex, the thermal expansion coefficient of which is equivalent to that of the semiconductor material forming the corresponding substrate. They have for example a diameter comprised between 100 mm and 300 mm.

Figure 2:
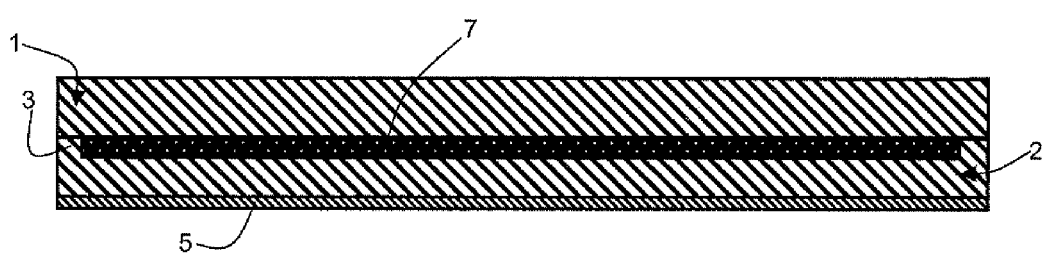
Figure 3:
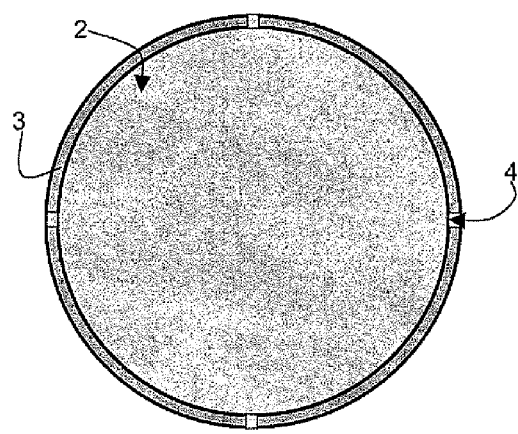
FIG. 3 represents a top view of the bulk substrate provided with a peripheral rim.

According to a particular embodiment represented in FIGS. 1 to 3, two substrates 1 and 2, for example made from silicon, are bonded to one another.

The substrate bearing the reference 2 in FIGS. 1 to 3 is provided with a salient rim 3 in which there are formed four uniformly arranged slits 4. Furthermore in this embodiment, rim 3 is a peripheral rim, i.e. a rim arranged at the periphery of surface 2b of substrate 2, in order to obtain a bonding space having the largest possible volume.

Rim 3 can be produced by any type of technique conventionally used in the microelectronics field. Rim 3 can thus for example be made by protecting beforehand the surface 2a of substrate 2 opposite to the surface in which rim 3 will be made, for example by deposition of a thin protective film 5 formed by a soft adhesive material (of acrylic type, sensitive to UV radiation and not requiring a temperature increase or a temporary cross-linked bonding resin such as that marketed by Brewer company). Substrate 2 is then turned upside down so as to make rim 3 provided with at least one slit 4, in surface 2b. The rim can for example be made by a dry or wet etching operation through a photoresist mask made beforehand by photolithography. The mask is then removed. It could also be made by etching using a laser beam to eliminate the parts of the substrate not protected by the mask that was made beforehand.

In FIG. 1, peripheral rim 3 then delineates a housing or cavity 6, in substrate 2, the bottom of which housing is substantially flat. Height H1 of rim 3 with respect to the bottom of housing 6 is moreover controlled when said rim is made so as to correspond to the thickness required for final adhesive layer 7 designed to perform bonding between the two substrates 1 and 2, once the latter has been solidified. Control of the height of peripheral rim 3 is obtained for example by controlling the etching parameters in the above-mentioned embodiment of the rim.

Furthermore, in FIG. 1, a drop of liquid adhesive 8 is deposited on substrate 2, in the bottom of housing 6, and substrate 1 is then moved progressively towards substrate 2 (arrows F1) so as to bring the two substrates 1 and 2 into contact. This contacting step can for example be performed using an assembly bench.

Height H2 of the drop of adhesive 8 being larger than a height HI of rim 3, substrate 1 first comes into contact with drop of adhesive 8 before its substantially flat surface 1a comes to rest on peripheral rim 3 of substrate 2. Contacting of surface 1a of substrate 1 with drop of liquid adhesive 8 therefore causes spreading of the liquid adhesive in housing 6. Furthermore, the meniscus created in contact between surface 1a of substrate 1 and drop of liquid adhesive 8 advantageously allows spreading of the adhesive, so that substrate 1 rests on, rim 3 just before liquid adhesive in the course of spreading reaches the level of rim 3. Moreover, the presence of slits 4 enables the excess adhesive to be evacuate via these passages rather than overflowing above rim 3. Rim 3 can be treated by means of surface treatment so as to make its top surface hydrophobic to the adhesive. This is particularly interesting in the case of poor surface flatness. Finally, the fact that surface 1a of substrate 1 is substantially flat with a very low level of unevenness advantageously ensures tightness of the stuck assembly, except at the level of slits 4. For example, the lack of flatness of surface 1a of substrate 1 is in typical manner much less than 10 μm for a substrate with a diameter of 150 mm.

Furthermore, the volume of drop of liquid adhesive 8 is chosen such as to be larger than the volume of the bonding space. The presence of slits 4 in the rim thus enables the excess liquid adhesive to be removed when contacting between the two substrates 1 and 2 is performed, thereby enabling an adhesive layer 7 to be obtained, once the latter has been solidified, of uniform thickness in housing 6 (moreover corresponding to height H1 of the rim). Slits 4 thus enable the excess adhesive and air bubbles present in housing 6 to escape. The volume of drop of liquid adhesive 8 therefore does not need to be calibrated with great precision to fill the volume of the bonding space without any excess. It can be in excess, as it is the volume of the bonding space associated with the presence of slits arranged in rim 3 that determines the final volume of adhesive and therefore the thickness of the final adhesive layer. Furthermore, contacting of the substrates can be performed without it being necessary to exert a pressure on one or the other of the substrates. This is particularly interesting in so far as application of a pressure on one or the other of the substrates during contacting of the latter may physically damage the substrates themselves or the components or circuitry made on these substrates (for example the brazing balls made on the front surfaces of the substrates). In the bonding method according to FIGS. 1 to 3, the pressure exerted by the weight of substrate 1 on substrate 2 is in fact sufficient to perform bonding.

The adhesive is advantageously an organic adhesive such as an epoxy or a polyimide, but it can also be an inorganic adhesive such as a silicone. It is deposited in liquid form, then once the two substrates have been brought into contact, it is solidified in the form of a solid layer 7 located at the interface between the two substrates, in the space delineated by the rim, between the two substrates and also called bonding space. This bonding space corresponds to housing 6 arranged in substrate 2 when substrates 1 and 2 are brought into contact with one another.

Solidification of the adhesive can advantageously be achieved by a cross-linking step, for example performed directly on the assembly bench of the two substrates, after a relaxation time in a vacuum for any air bubbles that may be present in the bonding space to be extracted. For example, the typical reticulation temperature for an epoxy adhesive is comprised between ambient temperature and 150° C. This cross-linking step can be performed with a suitable Temperature-Time pair.

In this embodiment, drop of liquid adhesive 8 is deposited on substrate 2, which is the substrate provided with rim 3. On the other hand, in an alternative embodiment, it could also be deposited on the other substrate, substrate 1. In this case, drop of liquid adhesive 8 would be deposited on surface 1a of substrate 1, and substrate 2 provided with rim 3 would then be placed above substrate 1, surface 2b provided with rim 3 being placed facing surface 1a of substrate 1 so as to be transferred onto surface 1a of substrate 1.

The embodiment represented in FIGS. 1 to 3 illustrates a bonding method between two substrates. On the other hand, as illustrated in the two foregoing embodiments, it is also possible to perform bonding of several substrates and in particular between a first substrate and a plurality of coplanar substrates separated by at least one dicing path.

Thus, in the embodiment represented in FIGS. 4 to 14, a first substrate 1, for example a bulk substrate, is transferred by bonding to a plurality of coplanar second substrates 2a, 2b, ..., 2i separated from one another by one or more dicing paths and advantageously thinned. A rim, more particularly a peripheral rim provided with of at least one slit, is made in each of the second substrates.

Figure 4:
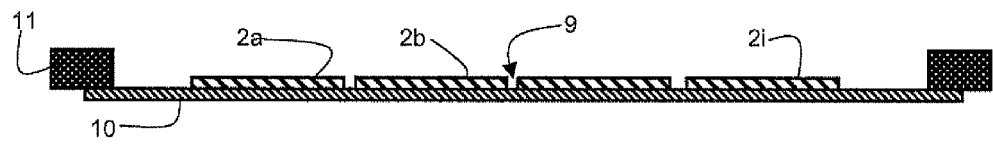
Figure 5:
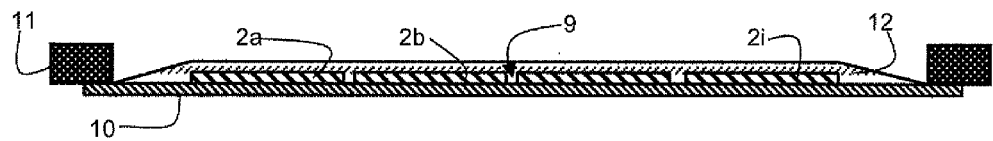
Figure 6:
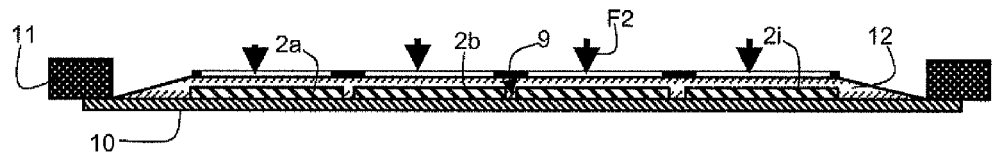
Figure 7:
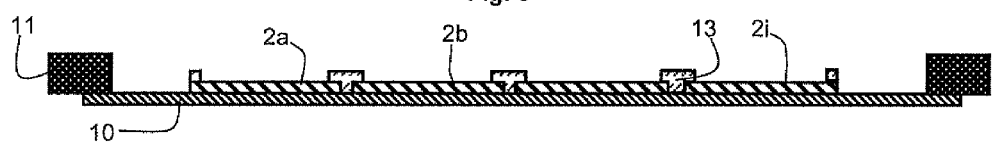
Figure 8:
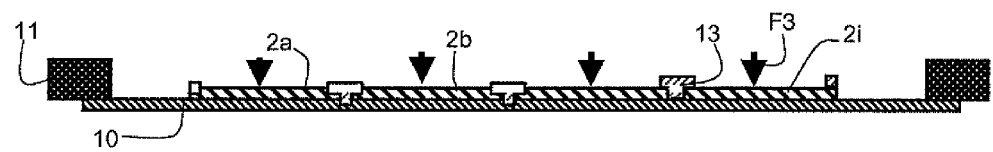
Figure 9:
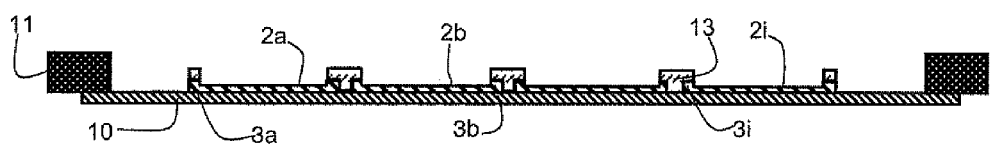

More particularly, the plurality of coplanar substrates 2a, 2b, ..., 2i separated by dicing paths 9 are produced by any type of techniques known in the micro-electronics field. In particular, they can be produced by a dicing method, also known under the acronym DBG (standing for Dicing Before Grinding), starting from a bulk substrate secured by a support film 10 to a securing frame 11 made of plastic or metal. The bulk substrate undergoes a thinning step to a depth slightly greater than the final thickness required for the second substrates 2a, 2b, ..., 2i, and the dicing paths 9 are then made to delineate and insulate second substrates 2a, 2b, ..., 2i from one another, as represented in FIG. 4. For example, for a final thickness of 30 μm, the depth of dicing performed during the thinning step is comprised between 35 μm and 40 μm. Furthermore, transfer of the bulk substrate to be thinned onto support film 10 can be performed by simultaneous lamination of this film on securing frame 11 and on the front surface of the bulk substrate.

Figure 10:
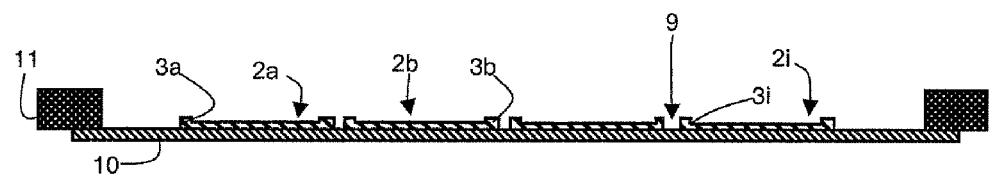
Figure 11:
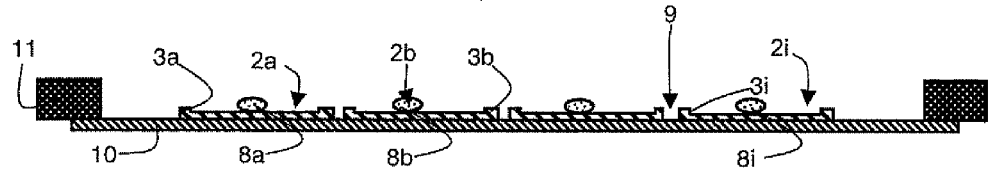

Then, as illustrated in FIGS. 5 to 10, a rim 3a, 3b, ... 3i is made at the periphery of each of the free surfaces of substrates 2a, 2b, ..., 2i. More particularly, a photoresist layer 12 is deposited, for example by sputtering, on the free surfaces of substrates 2a, 2b, ..., 2i (FIG. 5) to form an etching mask 13 by photolithography (arrows F2 in FIG. 6). Etching mask 13 covers a peripheral area on each surface of substrates 2a, 2b, ..., 2i, said area corresponding to the location where each peripheral rim 3a, 3b, ... 3i is to be formed. The etching mask further fills in dicing paths 9. Once the photoresist has been developed (FIG. 7), the step of localized etching through etching mask 13 (arrows F3 in FIG. 8) is performed in order to remove a part of each substrate not covered by etching mask 13 (FIG. 9) over a predefined depth (corresponding to the height required for the rims). This operation enables rims 3a, 3b, . . . 3i to be formed with their slits 4. The etching step can be performed by wet or gaseous method or by laser. Etching mask 13 is then removed (FIG. 10).

Figure 14:
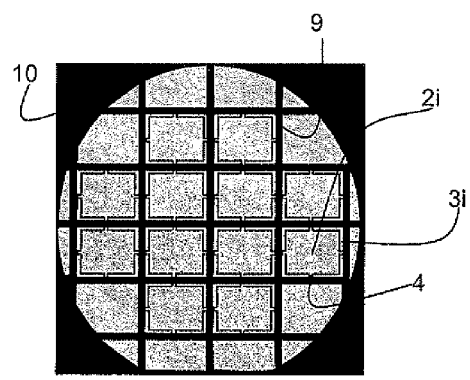
FIG. 14 illustrates, in top view, the plurality of thinned coplanar substrates provided with peripheral rims as advantageously obtained according to FIG. 10.
Figure 15:
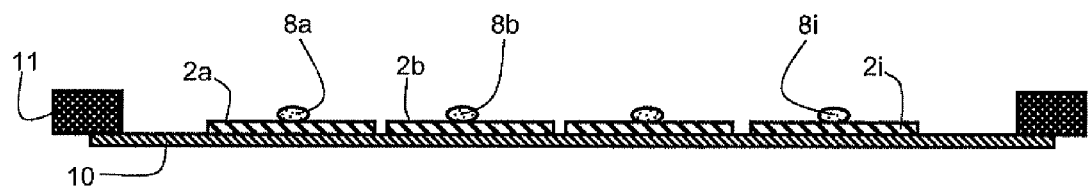

FIG. 14 illustrates a particular exemplary embodiment of a plurality of coplanar substrates 2a, 2b, . . . 2i of rectangular cross-section, separated from one another by dicing paths 9. A peripheral rim 3a, 3b, 3i provided with 4 slits 4 is formed in each substrate, each rim being located in the middle of a side of said peripheral rim. The number of slits 4 can however vary from one embodiment to another, advantageously between 1 and 4. Slits 4 can furthermore be pass-through or not. Peripheral rims 3a, 3b, . . . 3i advantageously all have the same height.

Figure 12:
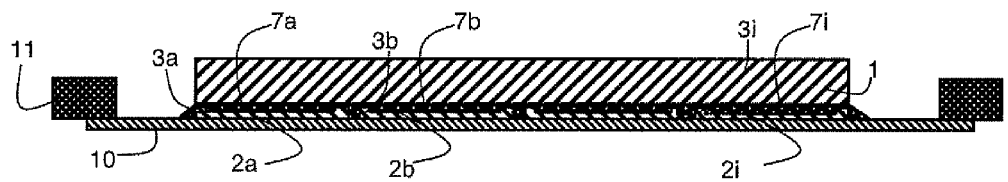
Figure 13:
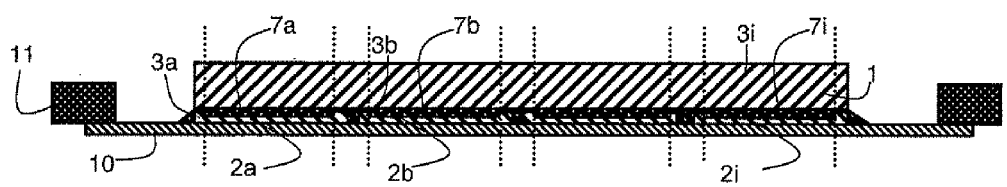

In the same way as in the previous embodiment, once the rims have been made in each of second substrates 2a, 2b, . . . , 2i, a drop of liquid adhesive 8a, 8b, . . . , 8i is deposited in the bottom of each housing 5a, 5b, . . . , 5i delineated by each of rims 3a, 3b, . . . 3i. Bulk substrate 1 is then transferred onto the assembly formed by the plurality of substrates 2a, 2b, . . . , 2i so that surface 1a of substrate 1 first of all comes into contact with drops of adhesive 8a, 8b, . . . , 8i before coming to rest on rims 3a, 3b, . . . 3i. Any excess liquid adhesive and any bubbles that may be present in the housings delineated by rims 3a, 3b, . . . , 3i can escape from the bonding space via slits 4 and the excess liquid adhesive can flow in dicing paths 9, as illustrated in FIG. 12. Once adhesive layers 7a, 7b, . . . 7i have solidified, for example by a heat treatment step, a dicing operation can be performed to separate substrates 2a, 2b, . . . , 2i from one another. The broken lines in FIG. 13 illustrate a particular dicing strategy consisting in eliminating the peripheral rim of each substrate. According to an alternative, the choice of keeping these peripheral rims can on the other hand also be envisaged.

In the third embodiment illustrated in FIGS. 15 to 19, a first substrate 1, advantageously a bulk substrate, is also bonded to a plurality of coplanar substrates 2a, 2b, . . . 2i, advantageously thinned and separated by one or more dicing paths 9. In this case on the other hand, the rims, each provided with at least one slit and designed to delineate the bonding spaces for the solidified adhesive layers, are made not on each of substrates 2a, 2b, . . . 2i, but on surface 1a of first bulk substrate 1. These rims are more particularly obtained by making ribs in surface 1a of first substrate 1. The location of the ribs is chosen in controlled manner, at particular locations, so that after bonding and eventually dicing, a rim corresponding to the periphery of each second substrate 2a, 2b, . . . , 2i is formed.

Figure 19:
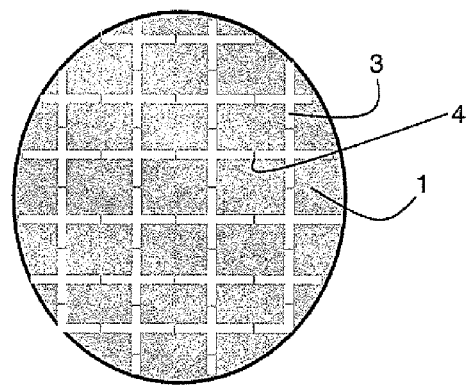
FIG. 19 illustrates, in top view, the substrate provided with rims as illustrated in FIG. 16.

For example purposes, FIG. 19 illustrates a particular embodiment of a bulk substrate 1 provided at the surface with a plurality of ribs designed to form rims 3 each provided with slits 4. Substrate 1 thus comprises a plurality of rims 3 each provided with 4 slits 4 on its surface, each slit being located in the middle of a side of a rim which in FIG. 19 has a rectangular cross-section. The number of slits 4 can however vary from one embodiment to another, advantageously between 1 to 4. Slits 4 can furthermore be pass-through or not. Rims 3a, 3b, . . . 3i also advantageously all have the same height.

Figure 16:
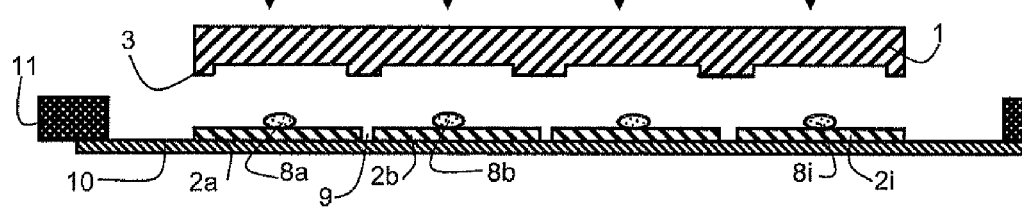
Figure 17:
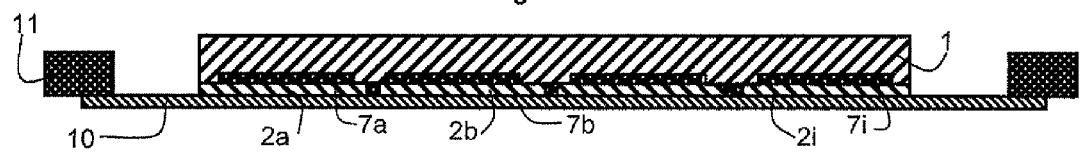
Figure 18:
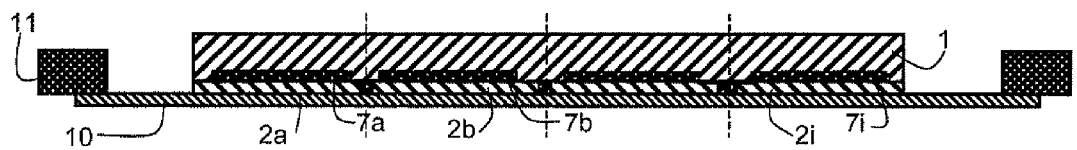

Once rims 3 have been made, a drop of liquid adhesive 8a, 8b, . . . , 8i is deposited, in this embodiment, on each free and substantially flat surface of substrates 2a, 2b, . . . , 2i. Bulk substrate 1 is then transferred onto the assembly formed by the plurality of substrates 2a, 2b, . . . , 2i so that surface 1a of substrate 1 comprising rims 3 first of all comes into contact with drops of adhesive 8a, 8b, . . . , 8i before coming to rest on rims 3a, 3b, . . . 3i (FIGS. 16 and 17). As in the previous embodiment, any excess liquid adhesive and any bubbles that may be present in the bonding spaces have the possibility of escaping from said housings via slits 4. In this case, the excess liquid adhesive can overflow into the dicing paths. Once adhesive 7a, 7b, . . . 7i has solidified, for example by a heat treatment step, a dicing operation can then be performed to separate substrates 2a, 2b, . . . , 2i from one another. The broken lines in FIG. 18 illustrate a particular dicing strategy consisting in following the dicing paths so that each assembly formed by a part of first substrate 1 and a second substrate 2a, 2b, . . . or 2i keeps a rim which becomes peripheral after dicing. In an alternative, the dicing operation could on the other hand be performed so as to eliminate rims 3.

The invention is not limited to the embodiments described above. In particular, the slits made in a rim can be in the form of passages passing through said rim from its free surface designed to come into contact with the other substrate through to the bottom of the housing delineated by said rim. In this case, the slits thus present a length equal to the height of the rim. According to an alternative, they can also be shorter. They are on the other hand always made from the free surface designed to come into contact with the other substrate. Furthermore, oxygen plasma-based activation treatment can for example be performed before deposition of the adhesive, preferably on the two surfaces designed to be contacted, in order to enhance the quality of adhesion at the bonding interface. Furthermore, it is also possible to perform anti-wetting deposition with respect to the adhesive, performed in selective manner on the rim, to avoid addition of an additional adhesive film to that made by the cavity. This is particularly interesting when the initial adhesive deposition is in excess.

I claim:

1. A method for bonding between at least two substrates comprising:
    providing a first substrate as one of the at least two substrates, the first substrate including a main face having an annular salient rim defining a bonding space and having an inner sidewall and an outer sidewall, the salient rim having at least one slit connecting the inner sidewall to the outer sidewall;
    providing a second substrate as one of the at least two substrates, the second substrate having a main face;
    depositing at least one drop of liquid adhesive on the main face of one of the two substrates, the volume of the drop of liquid adhesive deposited on one of the two substrates being greater than a volume of the bonding space; and
    bringing the two substrates into contact causing spreading of the liquid adhesive in the bonding space and flowing of an excess portion of the liquid adhesive through the slit formed in the rim.

2. The method according to claim 1, wherein the contacting step of the two substrates is performed without exerting any pressure on the first or the second substrate.

3. The method according to claim 1, wherein the depositing step of at least one drop of liquid adhesive is performed on the first substrate.

4. The method according to claim 1, wherein the depositing step of at least one drop of liquid adhesive is performed on the second substrate.

5. The method according to claim 1, wherein the second substrate includes a plurality of elementary coplanar substrates separated by a dicing path and fixed on a support film.

6. The method according to claim 5, wherein the first substrate includes an annular salient rim for each of the elementary coplanar substrates of the second substrate.

7. The method according to claim 5, wherein each of the elementary coplanar substrates of the second substrate includes, on the surface thereof, a salient rim in which at least one slit is formed, said rim being arranged at the periphery of the elementary coplanar substrate with which it is associated.

8. The method according to claim 5, wherein the first substrate and/or second substrates are thinned substrates.

9. The method according to claim 1, wherein the first substrate includes a plurality of elementary coplanar substrates separated by a dicing path and fixed on a support film.

10. The method according to claim 9, wherein each elementary coplanar substrate has an annular salient rim.

11. The method according to claim 9, wherein the first substrate and/or second substrates are thinned substrates.

* * * * *